US006452841B1

(12) United States Patent
Ferrant

(10) Patent No.: US 6,452,841 B1
(45) Date of Patent: Sep. 17, 2002

(54) DYNAMIC RANDOM ACCESS MEMORY DEVICE AND CORRESPONDING READING PROCESS

(75) Inventor: Richard Ferrant, Saint Ismier (FR)

(73) Assignee: STMicroelectronics S.A., Montrouge (FR)

(*) Notice: Subject to any disclaimer, the term of this patent is extended or adjusted under 35 U.S.C. 154(b) by 105 days.

(21) Appl. No.: 09/721,470

(22) Filed: Nov. 22, 2000

(30) Foreign Application Priority Data

Nov. 24, 1999 (FR) ............................................. 99 14792

(51) Int. Cl.[7] .............................................. G11C 11/56
(52) U.S. Cl. ...................... 365/188; 365/222; 365/196; 365/189.05; 365/202; 365/205; 365/185.24
(58) Field of Search ............................ 365/189.01, 188, 365/222, 196, 189.05, 202, 205, 185.24, 185.01

(56) References Cited

U.S. PATENT DOCUMENTS

| | | | |
|---|---|---|---|
| 4,506,349 A | 3/1985 | Mazin et al. ............... | 365/189 |
| 5,132,929 A | 7/1992 | Ochii ......................... | 365/201 |
| 5,444,652 A | 8/1995 | Furuyama .................. | 365/149 |
| 5,657,266 A | 8/1997 | McLaury ................... | 365/149 |
| 5,732,015 A | 3/1998 | Kazerounian et al. ...... | 365/154 |
| 5,912,853 A | 6/1999 | Rao ........................... | 365/205 |
| 6,005,799 A | * 12/1999 | Rao ........................... | 365/168 |
| 6,163,475 A | * 12/2000 | Proebsting .................. | 365/63 |
| 6,198,682 B1 | * 3/2001 | Proebsting .................. | 365/207 |
| 6,240,046 B1 | * 5/2001 | Proebsting .................. | 365/233 |
| 6,275,433 B1 | * 8/2001 | Forbes ....................... | 365/205 |
| 2002/0024863 A1 | * 2/2002 | Forbes ....................... | 365/203 |

* cited by examiner

Primary Examiner—Viet Q. Nguyen
(74) Attorney, Agent, or Firm—Lisa K. Jorgenson; Allen, Dyer, Doppelt, Milbrath & Gilchrist, P.A.

(57) ABSTRACT

A dynamic random access memory device includes a memory plane including at least one first matrix of memory cells, a read/write amplifier connected to the end of each column of the matrix, and at least one pair of input/output lines associated with the matrix. The dynamic random access memory device also includes at least one cache memory stage connected to each amplifier and is disposed in the immediate vicinity of this amplifier. The cache memory stage includes a static random access memory cell connected between the read/write amplifier and the pair of input/output lines.

41 Claims, 9 Drawing Sheets

DYNAMIC RANDOM ACCESS MEMORY DEVICE AND CORRESPONDING READING PROCESS

FIELD OF THE INVENTION

The present invention relates to dynamic random access memories (DRAM), and, more particularly, to the reading of a dynamic random access memory.

BACKGROUND OF THE INVENTION

As opposed to conventional static random access memories (SRAM) in which the information stored remains indefinitely as long as the memories remain energized, dynamic memories have the particular feature of requiring periodic refreshing of the information stored. Moreover, the reading of a binary data item stored in a dynamic random access memory cell is destructive. Consequently, if one wishes to preserve the data item in the dynamic memory cell after being read, it is necessary to rewrite the data item after this reading.

Conventionally, a dynamic random access memory includes a memory plane organized in matrix fashion into rows and columns of memory cells. A read/write amplifier is connected to the end of each column of the matrix, and a pair of input/output lines (I/O lines) is connected to each read/write amplifier. Moreover, each column of the matrix includes two bit lines. At least one of the bit lines is connected to all the memory cells of the column, and the other bit line serves as a reference. This is particularly so when dealing with memory cells with a transistor.

To read a data item stored in a memory cell of the memory plane, the bit lines of the relevant column are precharged to a common predetermined voltage, such as Vdd/2, for example. Vdd designates the supply voltage of the integrated circuit. The line of memory cells in which the memory cell to be read lies is then selected. If, for example, the data item stored was a logic 1, the bit line connected to the cell then sees its voltage increase with respect to the voltage of the reference bit line.

The read/write amplifier is then selected, and the node of this amplifier connected to the bit line then rises to the voltage Vdd. This is while the node of the amplifier linked to the reference bit line falls to ground. The consequential effect of this is to rewrite the data item to the memory cell.

To output this data item from the memory, the pair of input/output lines is then activated. In other words, the transistors linking this pair of input/output lines to the two above mentioned nodes of the read/write amplifier are rendered to be passing or activated. The voltage difference between the two input/output lines is then equal to the supply voltage Vdd in absolute value. The sign of this voltage difference determines the logic value of the information read.

However, on account of the large potential difference (Vdd) existing between the two input/output lines during the reading of a data item, and also on account of the fact that these input/output lines are relatively long, and consequently, have a relatively high capacitance, a non-negligible current spike occurs during the reading of the data item. This presents a penalty in terms of power consumption.

SUMMARY OF THE INVENTION

An object of the present invention is to provide a dynamic random access memory architecture exhibiting a lower current consumption during reading of the memory.

Another object of the present invention is to also increase the information throughput exchanged between the memory and other components, such as a microprocessor connected externally to the memory, for example.

This and other objects, advantages and features in accordance with the present invention are provided by a cache memory cell connected to each read/write amplifier, and is disposed near the read/write amplifier. This cache memory cell is linked to a pair of input/output lines. By disposing the cache memory cell near the amplifier, it is possible when transferring the data item to the cache memory cell via the amplifier to have a large potential difference (e.g., Vdd) only over a short and very weak capacitive metal connection. Consequentlly, this limits the current.

Moreover, this cache memory cell is a static random access memory cell whose content may be read using only a small percentage of the supply voltage (Vdd) of the device. The highly capacitive nature of the input/output lines is, therefore, compensated by the small voltage difference required for reading the data item contained in the cache memory cell.

Stated otherwise, the invention provides a dynamic random access memory device comprising a memory plane including at least one first matrix of memory cells, a read/write amplifier connected to the end of each column of the matrix, and at least one pair of input/output lines associated with the matrix. According to a general characteristic of the invention, the device furthermore comprises at least one cache memory stage connected to each amplifier and disposed in the immediate vicinity of this amplifier. This cache memory stage includes a static random access memory cell connected between the read/write amplifier and the pair of input/output lines.

However, the disposing of a static memory cell or even several cells in parallel in the immediate neighborhood of each read/write amplifier necessitates, in certain architectures in which the room available for disposing the SRAM cell is small, the use of a particularly compact static memory cell with a relatively low number of transistors. Conventional static memory cells generally comprise about 10 or more transistors, including four storage transistors and three precharge transistors. It then turns out to be impossible to install such a static memory cell when the space available at the foot of a read/write amplifier is small.

The invention advantageously provides a static random access memory cell including a very small number of transistors, and in particular, two storage transistors. This is done in the likeness of cache memory cell. However, with such a particularly compact static memory cell, there is a risk of losing the data item stored in this cell on account of leakage currents inherent to any transistor. It is for this reason that it is then necessary for the cache memory stage to also contain retention means for maintaining in the static memory cell a binary data item, that has been previously transferred thereto from a memory cell of the memory plane via the amplifier.

In one embodiment, a cache memory stage includes a static random access memory cell. The static random access memory cell comprises two storage transistors, and a pair of first access transistors connected between the amplifier and the storage transistors, a pair of second access transistors respectively connected between the pair of input/output lines and the storage transistors. Retention means maintains in the static memory cell a binary data item that had been previously transferred thereto from a memory cell via the amplifier.

In one embodiment, there is provision for the second access transistors to have larger leakage currents than the other transistors of the static memory cell. The retention means then includes the second access transistors. This embodiment is particularly compact. Several possibilities are offered for obtaining larger leakage currents in certain transistors than in others. Among these possibilities, those which will be mentioned now, may be used alone or in combination.

More precisely, a first possibility is with respect to the transistors which should exhibit the larger leakage currents. The transistors may include a channel length and a gate oxide thickness which are smaller than the channel length and the gate oxide thickness of the other transistors of the static memory cell.

As a variation, the retention means may apply different predetermined bias voltages at certain terminals of each transistor to obtain a larger leakage current. Stated otherwise, the transistors which exhibit a larger leakage current are directly acted on by increasing their leakage current by applying different predetermined bias voltages at certain terminals of these transistors.

Another possibility for embodying the retention means includes applying a substrate effect to each transistor of the static memory cell, with the exception of those transistors which one wishes should exhibit a larger leakage current. Thus, this characteristic is obtained by decreasing the leakage currents of the other transistors of the static memory cell by applying a substrate effect to these other transistors. In other words, different predetermined bias voltages are applied to the substrate and to the source of these transistors.

To increase the throughput of the dynamic random access memory device according to the invention, there is advantageously a provision for at least two cache memory stages to be connected respectively in parallel to each amplifier. Thus, for example, while reading a data item contained in a cache memory stage, it is possible to transfer a data item from a memory cell of the memory plane to the other cache memory stage.

The present invention is also directed to a process for reading a data item stored in a memory cell of the memory plane as defined above. The process includes transferring the data item to the static random access memory cell of the cache memory stage associated with the column containing the memory cell, then the content of the static memory cell is read via the input/output lines.

BRIEF DESCRIPTION OF THE DRAWINGS

Other advantages and characteristics of the invention will appear on examining the detailed description of non-limiting embodiments and of the appended drawings in which.

DETAILED DESCRIPTION OF THE PREFERRED EMBODIMENTS

In the example described here, each memory cell of the memory plane has been represented by a storage capacitor and an access transistor. The invention also applies to all types of dynamic memory cells comprising one or more transistors. The memory cell is connected by an access transistor to one of the bit lines, such as bit line BL. In other embodiments, it is also possible for the memory cell to be connected between the two bit lines. The access transistor is controlled by a word line WL.

Figure 1:
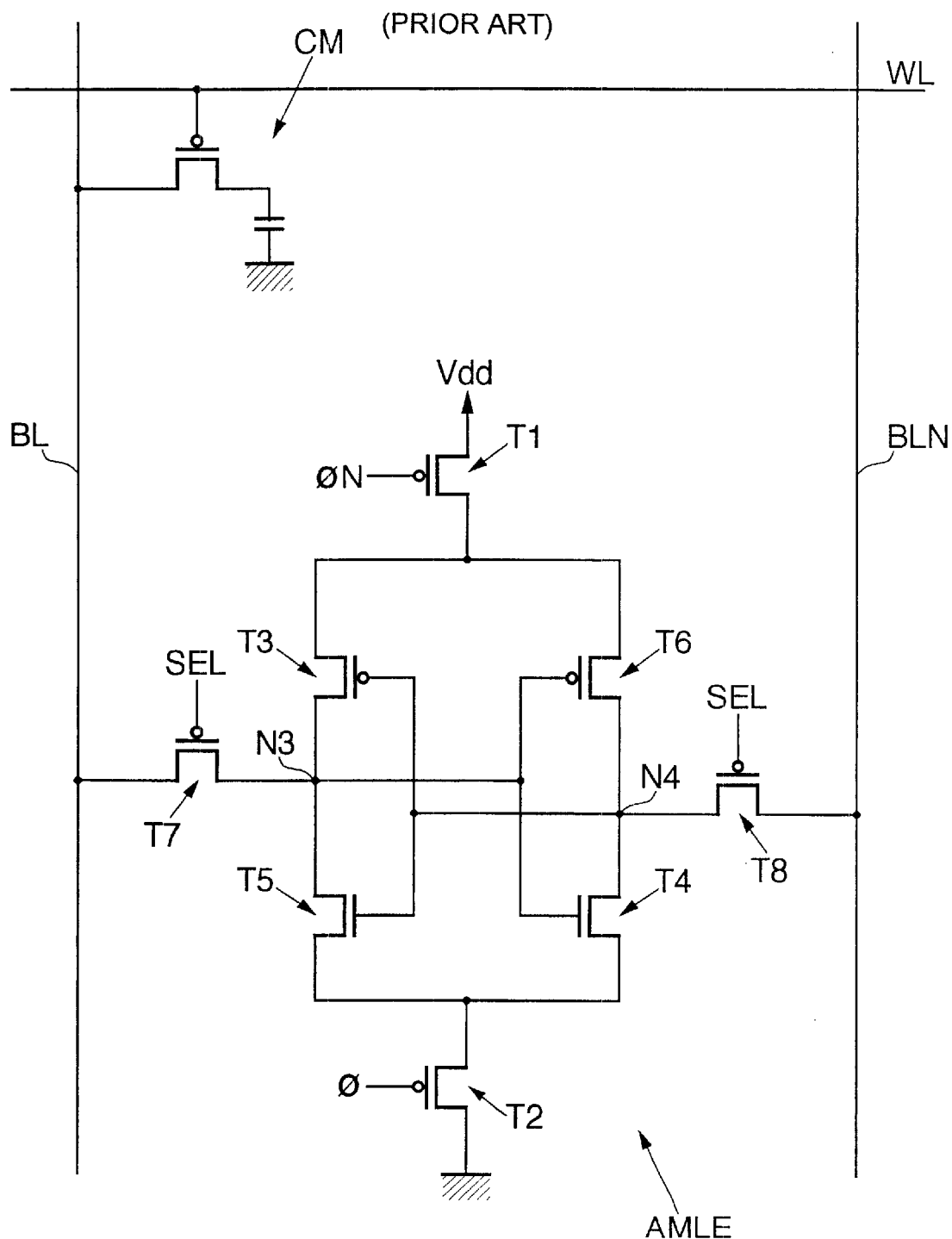
FIG. 1 illustrates a read/write amplifier connected to a memory plane column according to the prior art.

In FIG. 1, the references BL and BLN designate two bit lines belonging to a column of a matrix of memory cells of the memory plane of the device. At the bottom of the column, a read/write amplifier AMLE according to a conventional structure is represented in FIG. 1. More precisely, this amplifier AMLE is composed of a dual inverter formed by two PMOS transistors (P-channel insulated gate field effect transistors) T3 and T6, and of two NMOS transistors (N-channel transistors) T4 and T5. The common node N4 shared by the two transistors T4 and T6 is connected to the gates of the transistors T3 and T5. The common node N3 shared by the two transistors T3 and T5 is connected to the gates of the transistors T4 and T6.

The common terminal of the two transistors T3 and T6 is linked to the supply voltage Vdd by a PMOS transistor T1. The common terminal of the two transistors T5 and T4 is grounded by an NMOS transistor T2. These two transistors T2 and T1 are controlled by two complementary logic signals, respectively referenced Ø and ØN. The nodes N3 and N4 of the amplifier AMLE are connected respectively to the bit lines BL and BLN by two NMOS transistors T7 and TB controlled by a logic signal SEL.

The operation of such an amplifier is also conventional. The essential principles thereof will however be recalled here. It is assumed by way of example that a logic 1 value is stored in the memory cell CM. To read the data item CM, the bit line BL and the reference bit line BLN are first precharged to the same voltage, such as to voltage Vdd/2, for example. Thereafter, the row containing the cell CM is selected with the aid of the signal WL. For purposes of simplifying the drawing figures, the word line WL and the logic signal activating this word line have been represented by the same reference. The effect of this is to render the access transistor of the cell CM passing or activated. The voltage on the bit line BL is then equal to $Vdd/2+\Delta V$, while the voltage on the bit line BLN remains equal to Vdd/2.

The transistors T7 and T8 are activated, then the transistors T1 and T2 are activated. The voltage at the node N3, initially equal to $Vdd/2+\Delta V$, then rises to Vdd while the voltage at the node N4 drops to 0 after it was initially equal to Vdd/2. The effect of the rise of the voltage of node N3 to Vdd is to reestablish the voltage level across the terminals of the memory cell CM, and consequently, to rewrite back to this cell CM the data item which has just been read.

In the prior art, there was a provision for two transistors connected respectively between the nodes N3 and N4 of the read/write amplifier AMLE and two input/output lines. The reading of the data item at the output of the memory was then performed by rendering these two transistors active. The potential difference between the two input/output lines was then equal to Vdd. The sign of this difference made it possible to deduce therefrom the logic 0 or 1 content of the data item read.

Generally, in a dynamic random access memory, the input/output lines are relatively long and exhibit a highly capacitive nature, with a capacitance generally on the order of 500 fF. Also, the product of this capacitance times the voltage difference between the two input/output lines, in this instance the nominal supply voltage Vdd of the integrated circuit, leads to a large current spike during reading.

Figure 2:
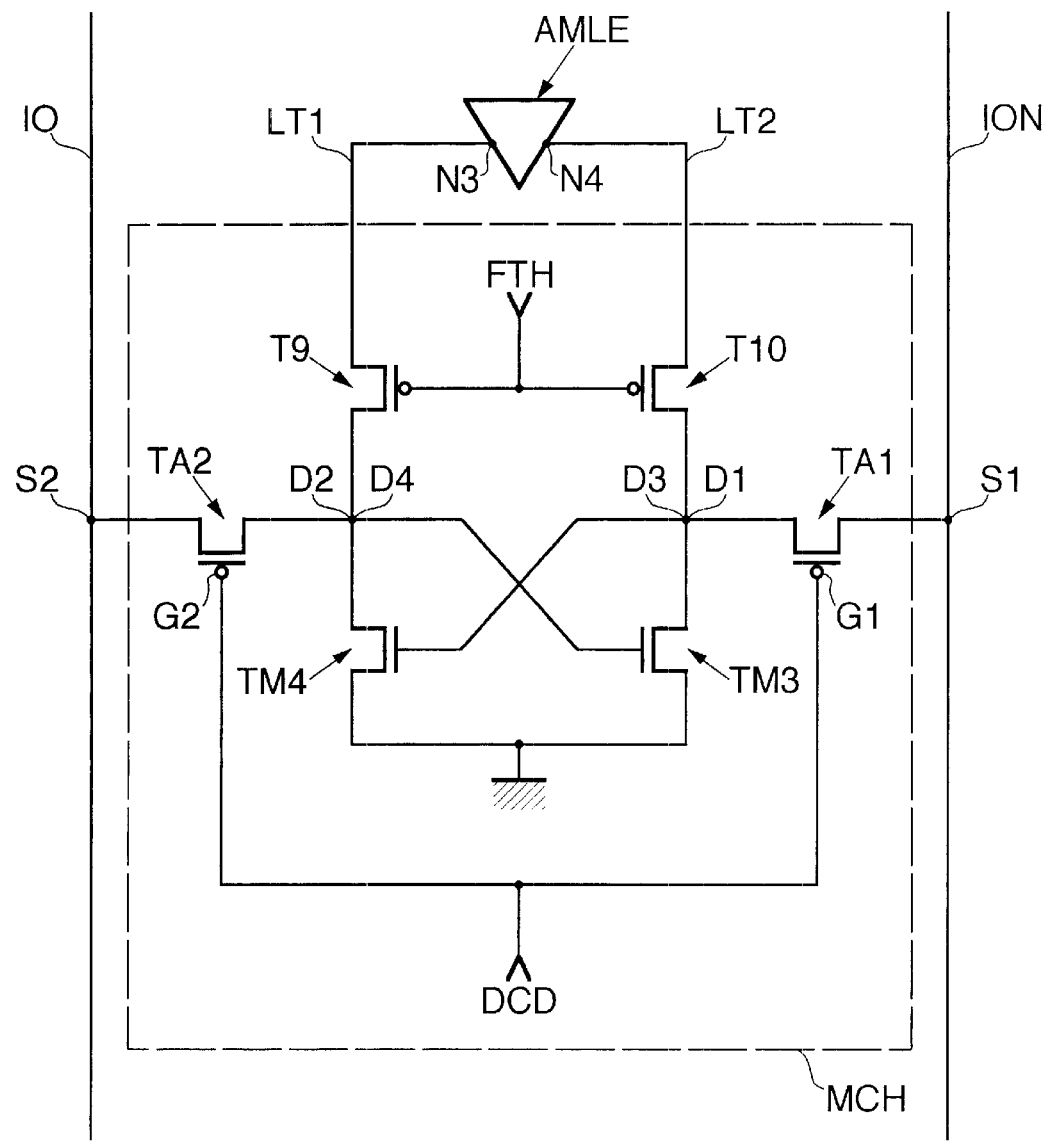
FIG. 2 illustrates a first embodiment of a cache memory stage according to the present invention, which is connected to the read/write amplifier of FIG. 1.
Figure 2:
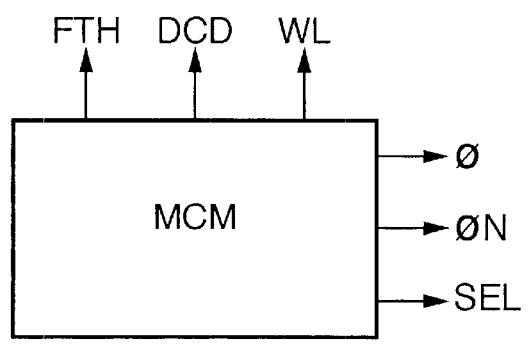
Figure 3:
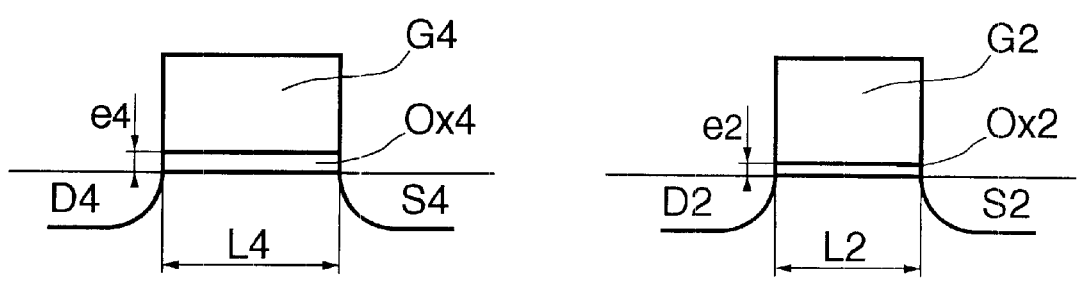
FIGS. 3 to 7 illustrate various possibilities for retaining a data item temporarily transferred to a cache memory stage.

The invention solves this problem by connecting between the read/write amplifier AMLE and the pair of input/output lines a cache memory stage MCH, as illustrated in FIG. 2. The cache memory stage includes a static random access memory cell having two storage transistors TM3 and TM4. In FIG. 2, the amplifier AMLE has been represented by a triangle and the nodes N3 and N4 have simply been depicted.

The static memory cell forming the cache memory stage MCH includes two first PMOS access transistors referenced T9 and T10, which are controlled at their gates by a control signal FTH. The source of the transistor T9 is linked to the node N3 by a very short metallization connection LT1, while the source of the transistor T10 is linked to the node N4 by a very short metallization connection LT2. The drain of the transistor T9 is linked to the drain D4 of the storage transistor TM4, while the drain of the transistor T10 is linked to the drain D3 of the storage transistor TM3. The sources of the two storage transistors TM3 and TM4 are grounded.

The gate of the transistor TM4 is linked to the drain D3 of the transistor TM3, while the gate of the other storage transistor TM3 is linked to the drain of the transistor TM4. The static memory cell also includes a second access port composed of the second access transistors TA1 and TA2. The transistors TA1 and TA2 are PMOS transistors controlled on their gates G1, G2 by a logic signal DCD. The drain D2 of the access transistor TA2 is linked to the drain D4 of the storage transistor TM4, while the drain D1 of the access transistor TA1 is linked to the drain D3 of the storage transistor TM3. The source S2 of the transistor TA2 is linked to the input/output line IO, while the source S1 of the access transistor TA1 is linked to the other input/output line ION.

The various logic signals FTH, DCD, WL, Ø, ØN and SEL are delivered by control logic circuit MCM, the structure of which is conventional within the field of memories, and which may therefore be readily embodied by a person skilled in the art.

The manner of operation of this cache memory cell MCH will now be described in greater detail so as to show the need to equip this cell with means of retaining the binary data item transferred thereto. The means of retention, as will be seen in greater detail below, may be obtained in various ways but are not represented in FIG. 2 for purposes of simplifying the drawing figures.

It is now assumed that the data item read from the memory cell CM of the memory plane was a logic 1 and that consequently after activating the read/write amplifier AMLE, the voltage Vdd is present at the node N3 while a zero voltage is present at the node N4. In the exemplary embodiment described in FIG. 2, the second access transistors TA1 and TA2 exhibit larger leakage currents than the leakage currents of all the other transistors of the cache memory cell.

Stated otherwise, their leakage current in the off state, that is, the drain/source current in the off state (current $I_{off}$) is greater than the leakage currents of the other transistors of the cache memory cell in their off state. Also, these more leaky access transistors TA1 and TA2 will help to avoid loss of the data item transferred to this cache memory cell MCH before its reading via the input/output lines IO and ION.

Before transferring the data item to the cell MCH, the input/output lines IO and ION are precharged to an identical common-mode voltage, such as to voltage Vdd, for example. Before transferring, the logical signal FTH is at 1, thus turning off the first access transistors T9 and T10. The logic signal DCD is also at 1, thus turning off the second access transistors TA1 and TA2.

To perform the transfer, the control logic circuit MCM sends the signal FTH to 0. This has the effect of rendering the transistors T9 and T10 active passing. The transistors TA1 and TA2 still remain turned off. The voltage at the drain D4 then rises to Vdd, thereby rendering the storage transistor TM3 active passing. Moreover, the voltage at the drain D3 falls to 0, thereby turning off the storage transistor TM4. The transistors T9 and T10 are again turned off by imparting the logic 1 value to the signal FTH. The binary data item is then transferred to the cache memory cell, and is stored therein at the nodes D4 and D1.

A person skilled in the art will then observe that if the transistor TM4, which is turned off, were more leaky than the transistor T9, which is also turned off, the binary information contained in the cache memory cell might disappear since the voltage at the drain D4 would tend to fall to 0 on account of the large leaky nature of the storage transistor TM4. Of course, the reasoning which has been explained here with the transistors TM4 and T9 would be the same with the transistors TM3 and T10 in the case where a logic 0 value had been stored in the memory cell CH. This would then lead to a voltage equal to Vdd at the node N4 and to a zero voltage at the node N3.

Moreover, if the transistor T9 were also relatively leaky, the binary information stored in the cache memory cell could also disappear were the content of the read/write amplifier AMLE to change. This would occur if a zero voltage were to be applied to the node N3, and a voltage equal to Vdd were to be applied to the node N4 subsequent to the transferring of the data item. This is because, in this case, the voltage Vdd present at the drain D4 might fall to 0 on account of the leakages of the transistor T9.

The invention solves this problem by rendering the access transistors TA1 and TA2 more leaky than the other transistors of the cell. In this case, since the access transistor TA2 is more leaky than the transistors T9 and TM4, the voltage at the drain D4 will be conditioned by the voltage at the source S2 of the transistor TA2, that is, the voltage on the input/output line IO. Since the voltage on the input/output line IO is equal to Vdd, and since the transistor TA2 is more leaky than the transistors T9 and TM4, the voltage at the drain D4 remains equal to Vdd. Of course, the reasoning just argued here with respect to the transistor TA2 and the line IO would be identical for the transistor TA1 and the line ION were it now drain D3 having a voltage equal to Vdd.

In parallel with this, the transistor TM3 is passing and the zero voltage present at the drain D3 remains zero. To read the data item contained in the cache memory cell MCH, the precharging of the input/output lines IO and ION is halted. The input/output lines IO and ION have a capacitive voltage level Vdd, which is no longer imposed by a voltage source. The 0 logic value is imparted to the signal DCD, thereby rendering the access transistors TA1 and TA2 active. The voltage on the input/output line IO remains equal to Vdd, while a transfer of charge occurs from the line ION to ground via the transistors TA1 and TM3.

Also, as soon as the voltage difference between the lines IO and ION reaches a sufficient level, in this instance a few tens of millivolts which corresponds to a few percent of the supply voltage Vdd, the amplifiers conventionally situated at the ends of the lines IO and ION are capable of detecting this voltage difference. It is therefore possible to deduce therefrom the logic value of the binary data item read as a function of the sign of this voltage difference. Since this reading requires only a few percent of the supply voltage Vdd, the current spike during reading is considerably decreased.

Moreover, since the cache memory cell is situated in the neighborhood of the amplifier AMLE, the metallizations connections LT1 and LT2 linking the nodes N3 and N4 of the amplifier AMLE to the cache memory cell are very short. Their length is on the order of 1 to 2 microns. Consequently, even if during the transferring of the data item to the cache memory cell via the amplifier AMLE, the voltage difference between the two metallizations connections LT1 and LT2 is equal to Vdd. The current consumed remains small since the small length of these metallizations connections LT1 and LT2 leads to small capacitances, which is typically on the order of a few fF (typically 5 fF).

The writing of a data item from outside the memory to the cache memory cell is achieved by forcing one of the input/output lines to ground and the other to Vdd. Various possibilities for rendering the two access transistors TA1 and TA2 more leaky than the other transistors of the cache memory cell will now be described while referring more particularly to FIGS. 3 to 7.

A first approach (FIG. 3) includes using, in the likeness of second access transistors TA1 and TA2, transistors whose thickness e2 of the gate oxide Ox2 is smaller than the thickness e4 of the gate oxide Ox4 of the other transistors of the cell. In this instance, this is transistors T9, T10, TM4 and TM3. Moreover, the second access transistors TA1 and TA2 will also be chosen to be transistors exhibiting a channel length L2. In other words, the drain/source distance is smaller than the channel length L4 of the other transistors of the cell.

From a practical point of view, it will be possible to embody the two access transistors with a 0.18 micron technology, for example. This leads to a length L2 on the order of 0.18 microns and a thickness e2 on the order of 35 Å. The other transistors of the cache memory cell will, for their part, be embodied with a 0.35 micron technology. This leads to a channel length L4 on the order of 0.35 microns and a gate oxide thickness e4 on the order of 70 Å.

Figure 4:
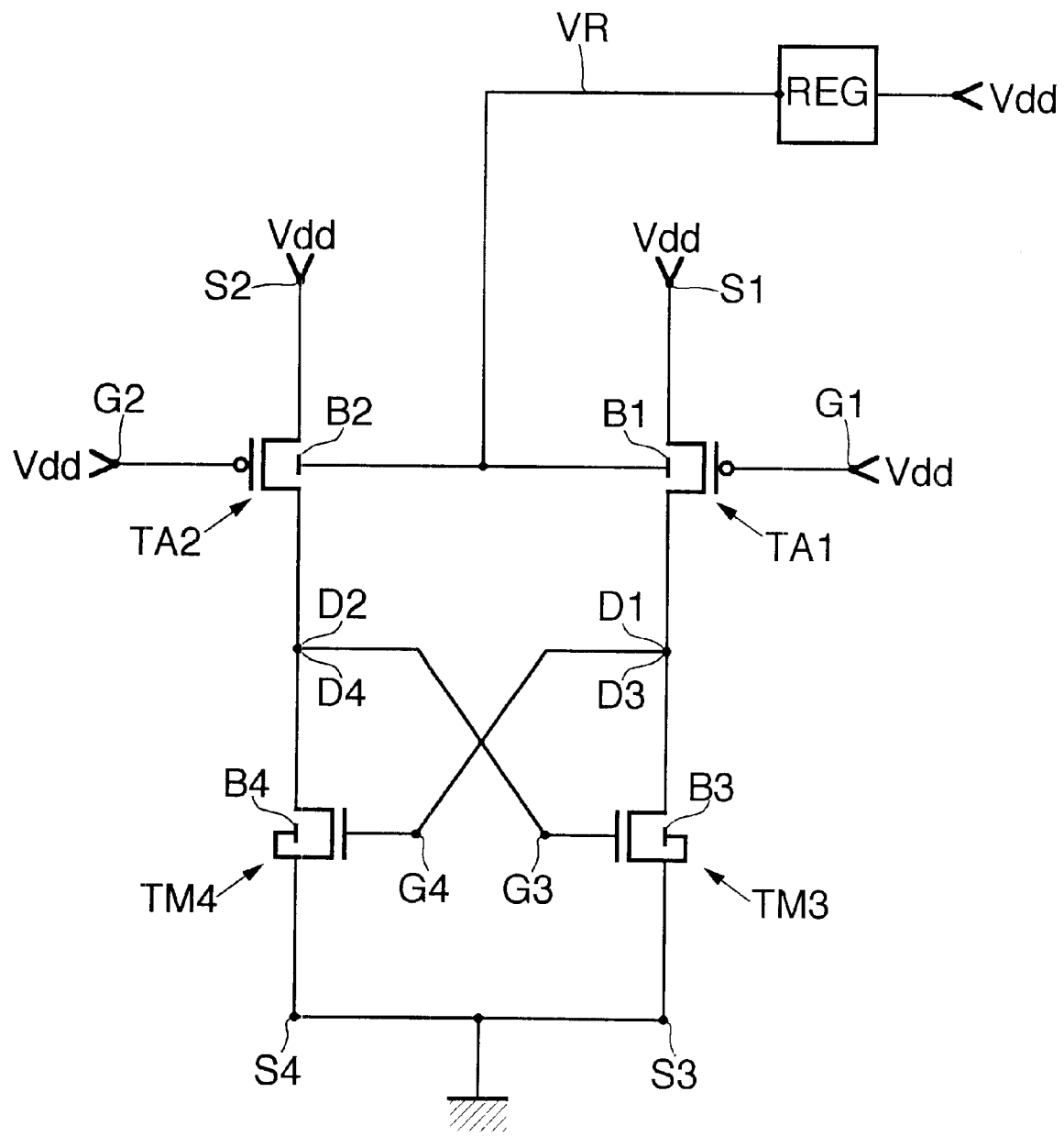

Another possibility for obtaining access transistors TA1 and TA2 which are more leaky than the other transistors of the cell of the cache memory MCH is illustrated in FIG. 4. This approach is compatible with the approach discussed above, and the two approaches may possibly be combined.

More precisely, in the variation illustrated in FIG. 4, the retention means then includes a regulated voltage source REG that is able to apply different predetermined bias voltages at certain terminals of each second access transistor TA2 and TA1. This is done to cause the flow in each second access transistor of a leakage current (drain/source current) which is greater, preferably at least ten times greater, than the leakage current of each other transistor of the static memory cell MCH.

In FIGS. 4 to 7, for purposes of simplifying the figures, only the storage transistors and the second access transistors have been represented. The first access transistors T9 and T10 have not been represented in these figures. Represented in FIG. 4 are the access transistors TA1 and TA2 in their off state with the logic signal DCD high. The voltage Vdd is applied to the gates G1 and G2 of these access transistors. Moreover, the sources S1 and S2, connected to the input/output lines ION and IO, are taken to the voltage Vdd.

The references B3 and B4 designate the substrates or bulk of the storage transistors TM3 and TM4. These substrates B3 and B4 are conventionally linked to the respective sources of these transistors, and consequently to ground. Likewise, the substrates of the first PMOS access transistors T9 and T10 are also conventionally linked to their source.

On the other hand, a substrate effect is applied to the PMOS transistors TA1 and TA2 by biasing the substrates B1 and B2 of these transistors with a voltage VR less than the source voltage. Which in this instance is the voltage Vdd applied to the input/output lines IO and ION. This voltage VR is obtained, for example, via a regulated voltage source REG, delivering from the voltage Vdd a regulated voltage VR equal to Vdd−0.15 volts, for example. This regulated voltage source can be obtained using a zener diode whose threshold voltage is suitably chosen.

More generally, the voltage difference between the source and the substrate of the access transistor TA1 or TA2 will preferably be chosen to be a voltage difference which is less than the threshold voltage of the transistor, for example, a voltage on the order of 0.15 to 0.3 volts. These orders of magnitude make it possible to obtain a leakage current for the transistors TA1 and TA2 which is slightly more than ten times greater than the leakage current of the other transistors of the static memory cell. This has been deemed to be acceptable to certain applications for good retention of the data item stored in the static memory cell.

Figure 5:
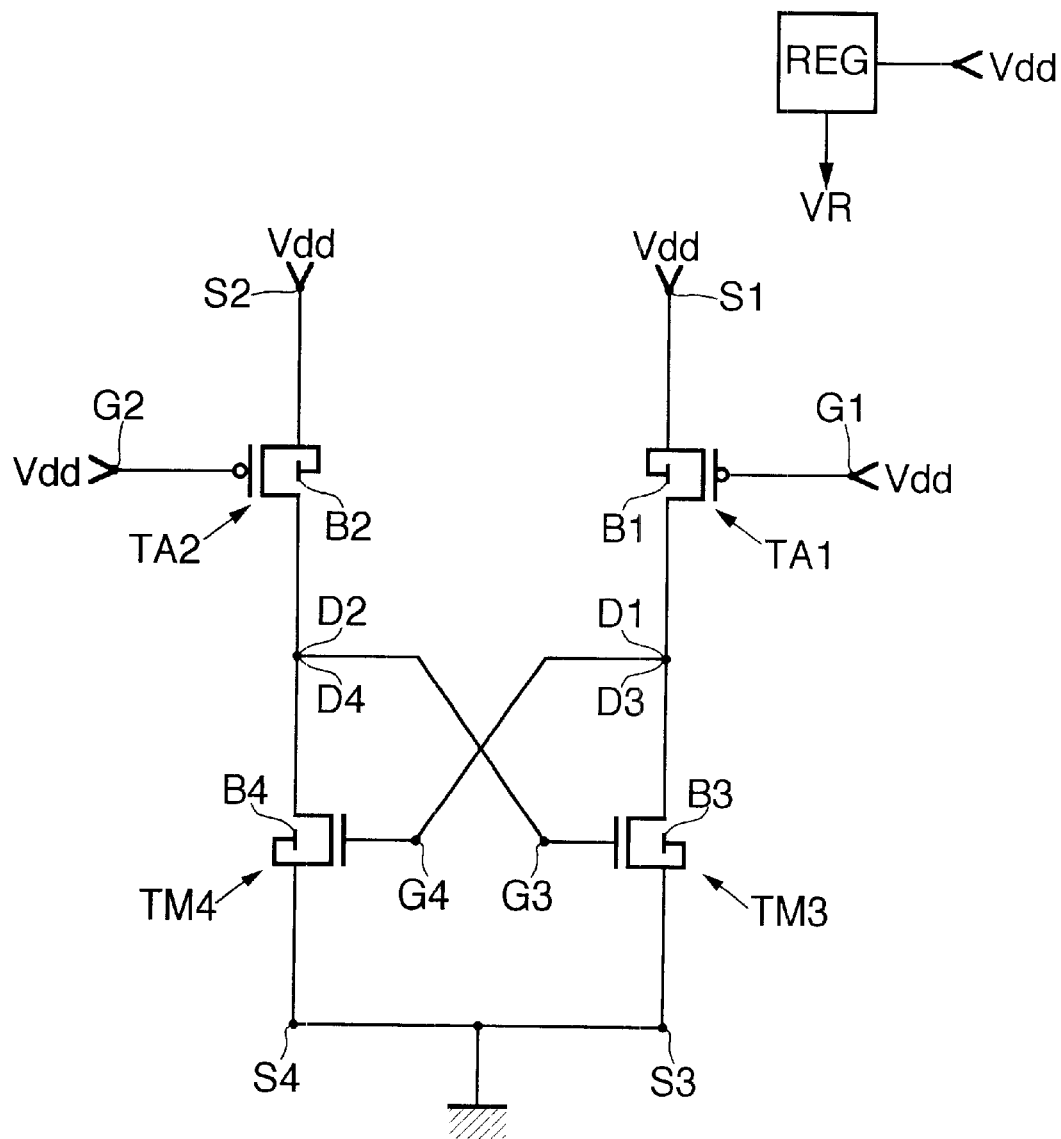

As a variation and as illustrated in FIG. 5, it is possible, while the substrate and the source of each access transistor TA1 and TA2 are linked together, to render each of these access transistors TA1 and TA2 and, in particular, in the present case the transistor TA2 slightly conducting. This is done by applying a voltage VR to the gate less than the voltage present on the input/output lines, i.e., the voltage applied to the sources S1 and S2. Here again, this gate/source voltage difference remains much less than the threshold voltage of the transistor so as to maintain it in an off state.

While in the variations illustrated in FIGS. 4 and 5, the second access transistors TA1 and TA2 is acted on so as to render them more leaky. The variations illustrated in FIGS. 6 and 7 now make provision to act on the other transistors of the static memory cell. In this instance the storage transistors TM3 and TM4 are acted on as well as the first access transistors T9 and T10, so as to render them less leaky, and consequently, so as to render the second transistors TA2 and TA1 more leaky.

Figure 6:
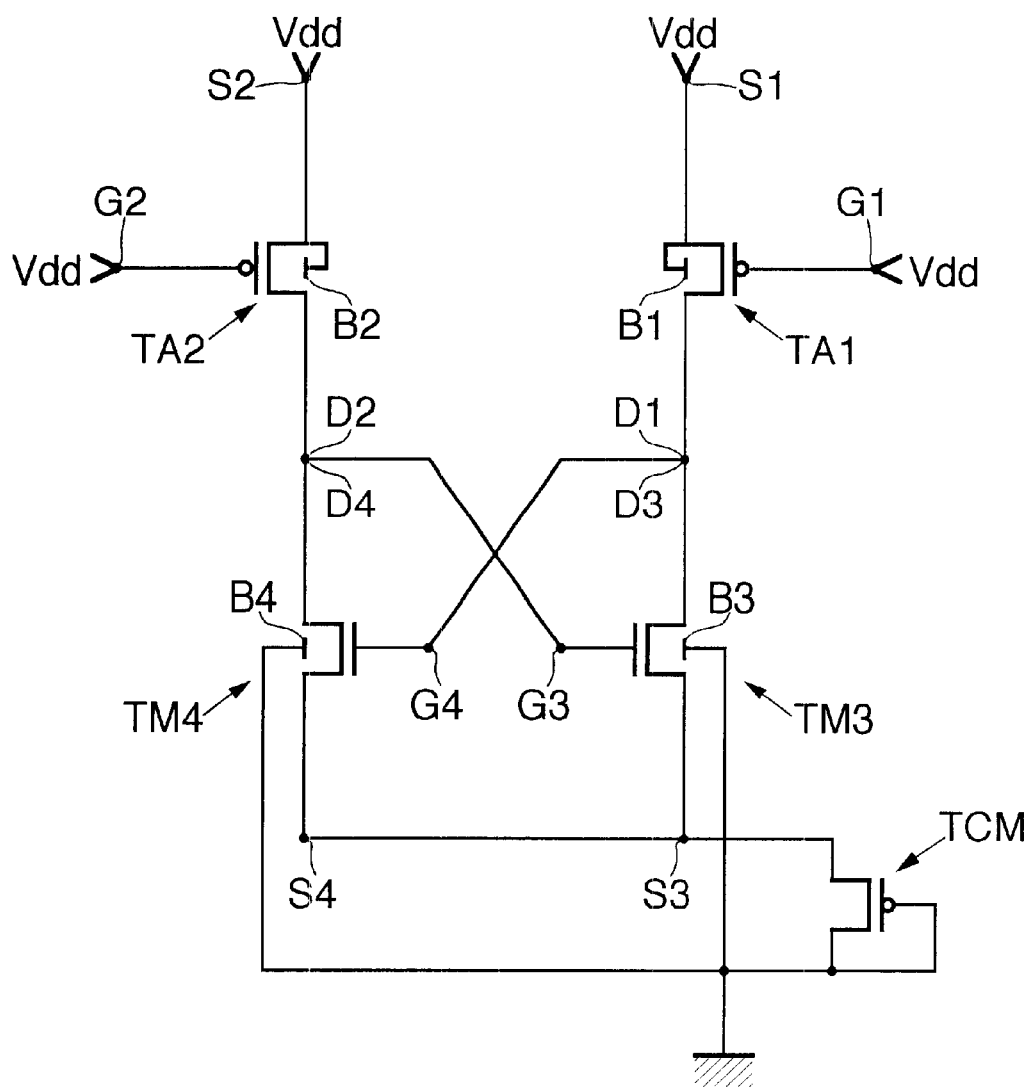
Figure 7:
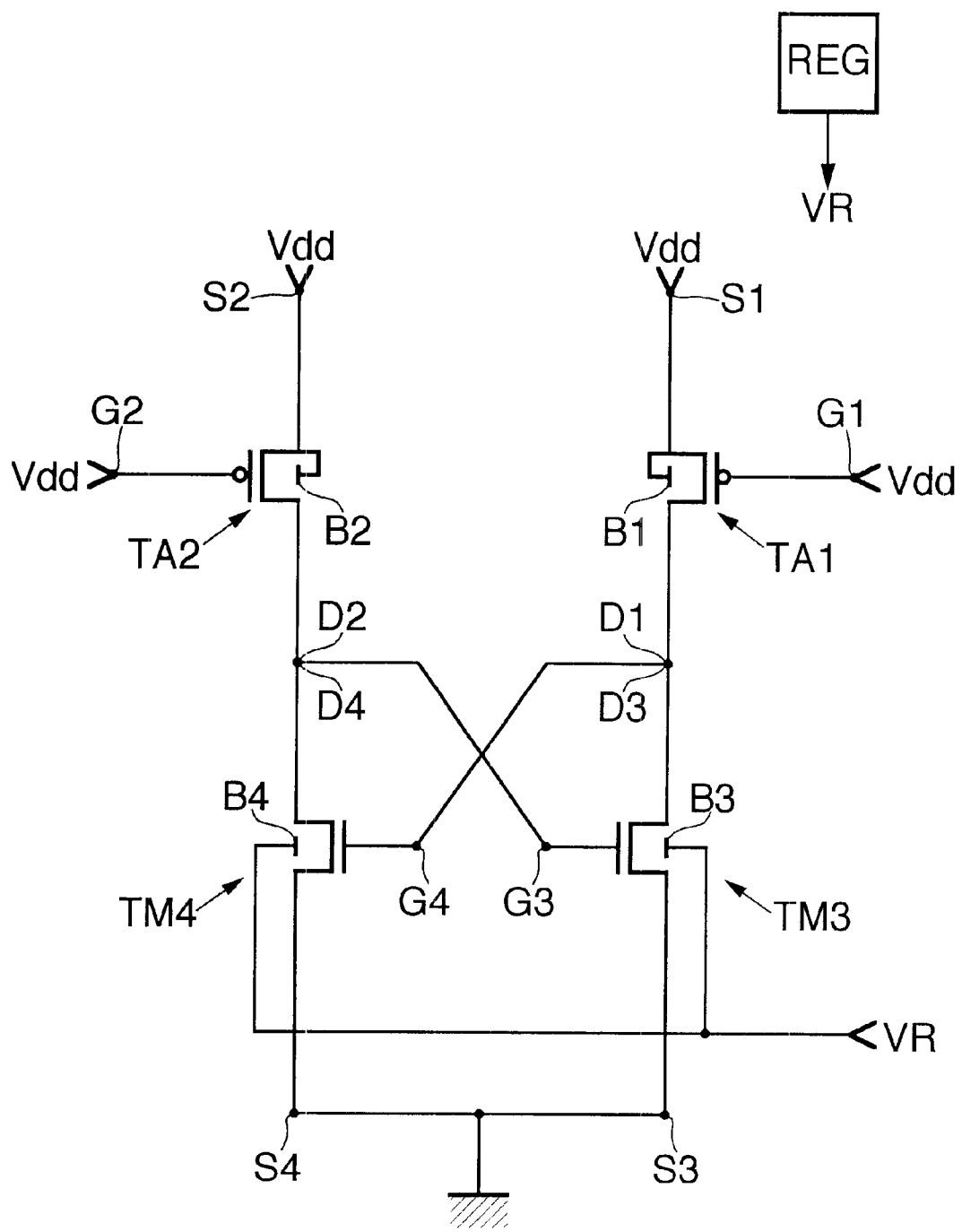

More precisely, in the variations illustrated in FIGS. 6 and 7, the retention means applies a substrate effect to each transistor of the static cell. In this instance, the storage transistors TM3 and TM4 and the first access transistors T9 and T10. An exception is for the second access transistors TA2 and TA1. The substrate obtains a leakage current of each second access transistor which is greater, preferably at least ten times greater, than the leakage current of each other transistor of the static memory cell.

In the variation illustrated in FIG. 6, the substrate taps B1 and B2 of the two access transistors TA2 and TA1 are linked to their source. On the other hand, the sources of the storage transistors TM3 and TM4 are biased with a voltage greater than their substrate voltage, which in this instance is ground.

In the present case, the means which make it possible to bias the source with a voltage greater than that of the substrate, include a PMOS transistor TCM which is always active. Thus, the source voltage is equal to the threshold voltage of the transistor TCM, i.e., around 0.5 volts. The threshold voltage of the storage transistors is increased, and consequently, the leakage current of these transistors is decreased through this substrate effect. A voltage difference between the source and the substrate on the order of 0.5 volts makes it possible to obtain, for a 0.25 micron technology, a ratio greater than 10. However, the difference is not too big between the leakage current of the second access transistors TA2 and TA1 and the leakage currents of the storage transistors, while keeping an acceptable dynamic range for the memory cell.

What is described here with respect to the storage transistors TM3 and TM4 is also valid with respect to the first PMOS access transistors T9 and T10 (FIG. 2). However, in this case, a substrate voltage greater than the source voltage of these transistors, for example, a substrate voltage equal to Vdd+1 volt obtained via a charge pump will be applied to the substrates of these transistors T9 and T10.

In FIG. 7, the substrate effect applied to the storage transistors TM3 and TM4 is now obtained by linking their source to ground and by applying a negative predetermined voltage VR, on the order of −1 volt to the substrates B3 and B4. The regulated voltage source REG which makes it possible to apply this voltage VR may, for example, include a negative charge pump having a conventional structure familiar to a person skilled in the art.

Such a variation is applicable with a so-called triple well technology, also familiar to a person skilled in the art. It is recalled here that in a triple well technology, the NMOS transistors are embodied within a P well insulated laterally from the substrate of the integrated circuit (wafer) by an N well. It is thus readily possibly to apply a negative substrate voltage to the contact tap of the NMOS transistor without similarly biasing the general substrate of the wafer.

Figure 8:
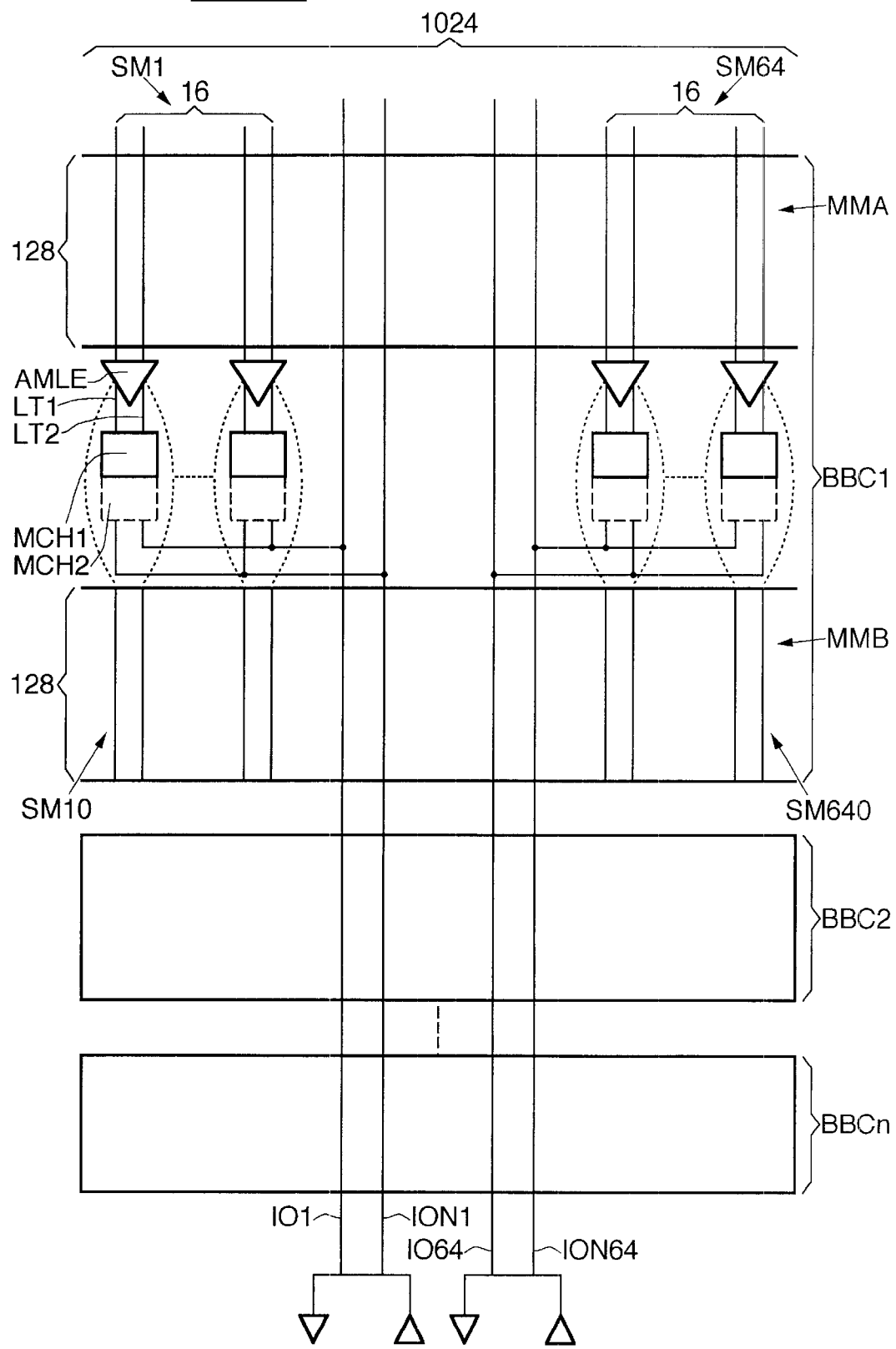
FIG. 8 illustrates an embodiment of a global architecture of a dynamic random access memory according to the present invention.

Represented in FIG. 8 is a global architecture of a dynamic random access memory device according to the present invention. In this figure, a group of 16 columns and 128 rows form a submatrix of memory cells. If the memory includes 1024 columns, then 64 submatrices SM1–SM64 are obtained. Each submatrix is then associated with a pair of input/output lines (IO1; ION1), . . . , (IO64; ION64). Each submatrix is associated with different input/output line pairs. Also, all the cache memory stages associated with a submatrix are all connected in parallel to the input/output line pair associated with this submatrix.

Moreover, in the example illustrated in FIG. 8, two cache memory stages MCH1, MCH2 are respectively connected in parallel to each read/write amplifier AMLE. The 64 submatrices SM1–SM64 of 16 columns form a matrix of memory cells MMA.

A memory block BBC1 of the memory plane then includes a second matrix MMB structurally analogous to the first matrix MMA and is also composed of 64 submatrices SM10–SM640. The amplifiers AMLE, the cache memory stages MCH1, MCH2 and the input/output line pairs (IO1; ION1), . . . , (IO64; ION64) are common to the two matrices MMA and MMB. These two matrices are connected in an identical manner in parallel to the amplifiers, cache memory stages and input/output line pairs. The memory plane includes several memory blocks, for example, four: BBC1, BBC2, . . . , BBCn. The input/output line pairs are then common to the various memory blocks.

A person skilled in the art will have noted that the second access transistors TA1 and TA2 participate in the decoding of the columns. Moreover, with such an architecture, 16 items of information contained in 16 memory cells can be extracted successively with the same pair of input/output lines. Moreover, it is possible, by simultaneously activating the 64 pairs of input/output lines, to simultaneously obtain 64 items of information at output. What is possible horizontally is also possible vertically, by selecting columns situated in different submatrices and joined to the same pair of input/output lines.

The memory device according to the invention therefore makes it possible to extract the information stored in bidimensional bursts, this being especially beneficial in video applications. The latency is thus eliminated in both the horizontal direction and the vertical direction, thereby making it possible in graphical applications to perform identical processing operations with respect of a lateral motion or a vertical motion of the image.

Figure 9:
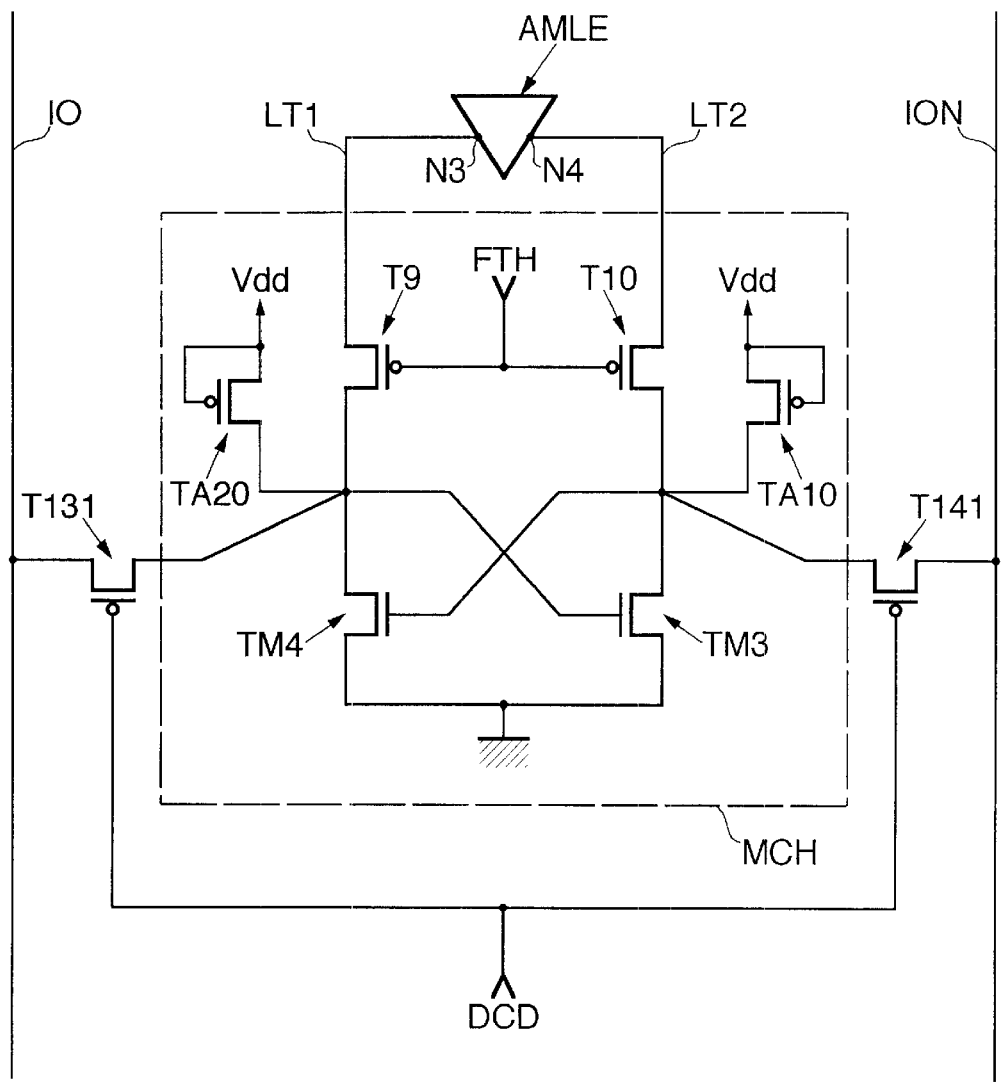
FIG. 9 illustrates another embodiment of a cache memory stage according to the present invention.
Figure 9:
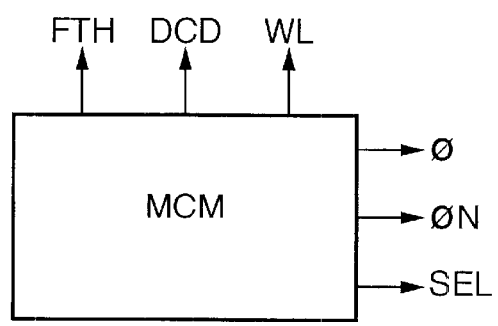

FIG. 9 illustrates another embodiment of a cache memory stage according to the present invention. For purposes of simplifying the figures, only the differences between this variation and the variation just described with reference to FIG. 2 will be described here.

Apart from the second access transistors T131 and T141 which link the storage transistors to the input/output lines IO and ION, the static memory cell includes a pair of auxiliary transistors which are permanently turned off and connected respectively between the storage transistors and a predetermined voltage source.

In this instance, the transistors TA1C and TA20 are PMOS transistors whose gates and sources are linked together to the supply voltage Vdd. It is these auxiliary transistors which exhibit greater leakage currents than the other transistors of the static memory cell. Stated otherwise, the auxiliary transistors TA10 and TA20 must exhibit greater leakage currents than the storage transistors TM4 and TM3, than the first access transistors T9 and T10, and than the second access transistors T131 and T141. Therefore, the retention means include these auxiliary transistors.

Various possibilities described hereinabove in order to impart larger leakage currents to the access transistors TA1 and TA2 apply to the auxiliary transistors. Relative to the variation illustrated in FIG. 2, this static memory cell exhibits a slightly larger footprint on account of the presence of two additional auxiliary transistors. However, it offers the possibility of applying any common-mode voltage to the input/output lines IO and ION.

Everything just described would apply also to a device whose PMOS transistors are NMOS transistors and vice versa. A person skilled in the art will be able to make the necessary modifications. By way of indication, the voltage Vdd shall have to be replaced by ground and vice versa. Likewise, the substrate effects obtained by substrates taken to a supply voltage Vdd decreased by a few millivolts for PMOS transistors, shall have to be taken to a voltage of a few millivolts instead of ground for the NMOS transistors and vice versa.

That which is claimed is:

1. A dynamic random access memory comprising:
   at least one first matrix of memory cells arranged in rows and columns;
   a read/write amplifier connected to each column;
   at least one pair of input/output lines associated with said at least one first matrix of memory cells; and
   at least one cache memory stage connected to each read/write amplifier and comprising a static random access memory cell connected between a respective read/write amplifier and said at least one pair of input/ output lines.

2. A dynamic random access memory according to claim 1, wherein each static random access memory cell comprises:
   a pair of storage transistors;
   a pair of first access transistors connected between said respective read/write amplifier and said pair of storage transistors; and a data retention circuit comprising a pair of second access transistors respectively connected between said at least one pair of input/output lines and said pair of storage transistors, said pair of second access transistors for maintaining in said static random access memory cell binary data having been previously transferred thereto from a memory cell via said respective read/write amplifier.

3. A dynamic random access memory according to claim 2, wherein said pair of second access transistors have leakage currents greater than leakage currents of said pair of storage transistors and said pair of first access transistors.

4. A dynamic random access memory according to claim 2, wherein said data retention circuit further comprises:
a pair of auxiliary transistors which are permanently turned off and are respectively connected between said pair of storage transistors and a voltage source, said pair of auxiliary transistors having leakage currents greater than leakage currents of said pair of storage transistors and said pairs of first and second access transistors.

5. A dynamic random access memory according to claim 4, wherein at least one of said pair of second access transistors and said pair of auxiliary transistors have a channel length and a gate oxide thickness smaller than a channel length and a gate oxide thickness of said pair of storage transistors and said pair of first access transistors.

6. A dynamic random access memory according to claim 4, further comprising a substrate and wherein said static random access memory cell is formed thereon; and wherein said data retention circuit further comprises a voltage source for applying a voltage to said substrate with respect to said pair of storage transistors and said pair of first access transistors to obtain a leakage current of each auxiliary transistor or of each second access transistor which is at least 10 times greater than a leakage current of said pair of storage transistors and said pair of first access transistors.

7. A dynamic random access memory according to claim 4, wherein said data retention circuit is configured to apply different predetermined bias voltages at selected terminals of each second access transistor or of each auxiliary transistor to cause a current to flow in each second access transistor or in each auxiliary transistor that is at least 10 times greater than a leakage current of said pair of storage transistors and said pair of first access transistors.

8. A dynamic random access memory according to claim 1, wherein said at least one first matrix of memory cells is divided into a plurality of submatrices; wherein said at least one pair of input/output lines comprises a plurality of pairs of input/output lines so that each submatrix has associated therewith a pair of input/output lines; and wherein each cache memory stage associated with a submatrix is connected in parallel to a respective pair of input/output lines associated with the submatrix.

9. A dynamic random access memory according to claim 8, wherein said at least one first matrix of memory cells comprises a first block of memory cells and a second block of memory cells; and wherein said first and second blocks of memory cells are connected in parallel to each respective read/write amplifier, to each respective pair of input/output lines, and to each respective cache memory stage.

10. A dynamic random access memory according to claim 9, wherein said at least one first matrix of memory cells comprises a plurality of blocks of memory cells; and wherein said at least one pair of input/output lines is connected in common to said plurality of blocks of memory cells.

11. A dynamic random access memory according to claim 1, wherein said at least one cache memory stage connected to each read/write amplifier comprises at least two cache memory stages connected in parallel to each respective read/write amplifier.

12. A dynamic random access memory comprising:
at least one first matrix of memory cells arranged in rows and columns;
a read/write amplifier connected to each column;
at least one pair of input/output lines associated with said at least one first matrix of memory cells; and
at least one cache memory stage connected to each read/write amplifier and comprising a static random access memory cell connected between a respective read/write amplifier and said at least one pair of input/output lines, each static random access memory cell comprising
a pair of storage transistors,
a pair of first access transistors connected between said respective read/write amplifier and said pair of storage transistors, and
a data retention circuit connected between said at least one pair of input/output lines and said pair of storage transistors for maintaining in said static random access memory cell binary data having been previously transferred thereto from a memory cell via said respective read/write amplifier.

13. A dynamic random access memory according to claim 12, wherein said data retention circuit comprises a pair of second access transistors.

14. A dynamic random access memory according to claim 13, wherein said pair of second access transistors have leakage currents greater than leakage currents of said pair of storage transistors and said pair of first access transistors.

15. A dynamic random access memory according to claim 13, wherein said data retention circuit further comprises:
a pair of auxiliary transistors which are permanently turned off and are respectively connected between said pair of storage transistors and a voltage source, said pair of auxiliary transistors having leakage currents greater than leakage currents of said pair of storage transistors and said pairs of first and second access transistors.

16. A dynamic random access memory according to claim 15, wherein at least one of said pair of second access transistors and said pair of auxiliary transistors have a channel length and a gate oxide thickness smaller than a channel length and a gate oxide thickness of said pair of storage transistors and said pair of first access transistors.

17. A dynamic random access memory according to claim 15, further comprising a substrate and wherein said static random access memory cell is formed thereon; and wherein said data retention circuit further comprises a voltage source for applying a voltage to said substrate with respect to said pair of storage transistors and said pair of first access transistors to obtain a leakage current of each auxiliary transistor or of each second access transistor which is at least 10 times greater than a leakage current of said pair of storage transistors and said pair of first access transistors.

18. A dynamic random access memory according to claim 15, wherein said data retention circuit is configured to apply different predetermined bias voltages at selected terminals of each second access transistor or of each auxiliary transistor to cause a current to flow in each second access transistor or in each auxiliary transistor that is at least 10 times greater than a leakage current of said pair of storage transistors and said pair of first access transistors.

19. A dynamic random access memory according to claim 12, wherein said at least one first matrix of memory cells is divided into a plurality of submatrices; wherein said at least one pair of input/output lines comprises a plurality of pairs of input/output lines so that each submatrix has associated therewith a pair of input/output lines; and wherein each cache memory stage associated with a submatrix is connected in parallel to a respective pair of input/output lines associated with the submatrix.

20. A dynamic random access memory according to claim 19, wherein said at least one first matrix of memory cells comprises a first block of memory cells and a second block of memory cells; and wherein said first and second blocks of memory cells are connected in parallel to each respective read/write amplifier, to each respective pair of input/output lines, and to each respective cache memory stage.

21. A dynamic random access memory according to claim 20, wherein said at least one first matrix of memory cells comprises a plurality of blocks of memory cells; and wherein said at least one pair of input/output lines is connected in common to said plurality of blocks of memory cells.

22. A dynamic random access memory according to claim 12, wherein said at least one cache memory stage connected to each read/write amplifier comprises at least two cache memory stages connected in parallel to each respective read/write amplifier.

23. A dynamic random access memory comprising:
at least one first matrix of memory cells arranged in rows and columns;
a read/write amplifier connected to each column;
at least one pair of input/output lines associated with said at least one first matrix of memory cells; and
at least one cache memory stage connected to each read/write amplifier and comprising a static random access memory cell connected between a respective read/write amplifier and said at least one pair of input/output lines, each static random access memory cell comprising
a pair of storage transistors,
a pair of first access transistors connected between said respective read/write amplifier and said pair of storage transistors, and
a data retention circuit comprising
a pair of second access transistors respectively connected between said at least one pair of input/output lines and said pair of storage transistors, and
a pair of auxiliary transistors respectively connected between said pair of storage transistors and a voltage source.

24. A dynamic random access memory according to claim 23, wherein said data retention circuit maintains in said static random access memory cell binary data having been previously transferred thereto from a memory cell via said respective read/write amplifier.

25. A dynamic random access memory according to claim 23, wherein said pair of second access transistors and said pair of auxiliary transistors have leakage currents greater than leakage currents of said pair of storage transistors and said pair of first access transistors.

26. A dynamic random access memory according to claim 23, wherein said pair of auxiliary transistors are permanently turned off.

27. A dynamic random access memory according to claim 23, wherein at least one of said pair of second access transistors and said pair of auxiliary transistors have a channel length and a gate oxide thickness smaller than a channel length and a gate oxide thickness of said pair of storage transistors and said pair of first access transistors.

28. A dynamic random access memory according to claim 23, further comprising a substrate and wherein said static random access memory cell is formed thereon; and wherein said data retention circuit further comprises a voltage source for applying a voltage to said substrate with respect to said pair of storage transistors and said pair of first access transistors to obtain a leakage current of each auxiliary transistor or of each second access transistor which is at least 10 times greater than a leakage current of said pair of storage transistors and said pair of first access transistors.

29. A dynamic random access memory according to claim 23, wherein said data retention circuit is configured to apply different predetermined bias voltages at selected terminals of each second access transistor or of each auxiliary transistor to cause a current to flow in each second access transistor or in each auxiliary transistor that is at least 10 times greater than leakage currents of said pair of storage transistors and said pair of first access transistors.

30. A dynamic random access memory according to claim 23, wherein said at least one first matrix of memory cells is divided into a plurality of submatrices; wherein said at least one pair of input/output lines comprises a plurality of pairs of input/output lines so that each submatrix has associated therewith a pair of input/output lines; and wherein each cache memory stage associated with a submatrix is connected in parallel to a respective pair of input/output lines associated with the submatrix.

31. A dynamic random access memory according to claim 30, wherein said at least one first matrix of memory cells comprises a first block of memory cells and a second block of memory cells; and wherein said first and second blocks of memory cells are connected in parallel to each respective read/write amplifier, to each respective pair of input/output lines, and to each respective cache memory stage.

32. A dynamic random access memory according to claim 31, wherein said at least one first matrix of memory cells comprises a plurality of blocks of memory cells; and wherein said at least one pair of input/output lines is connected in common to said plurality of blocks of memory cells.

33. A dynamic random access memory according to claim 23, wherein said at least one cache memory stage connected to a respective read/write amplifier comprises at least two cache memory stages connected in parallel to each respective read/write amplifier.

34. A method for reading a data item stored in a dynamic random access memory comprising at least one first matrix of memory cells arranged in rows and columns, a read/write amplifier connected to each column, at least one pair of input/output lines associated with the at least one first matrix, and at least one cache memory stage connected to each read/write amplifier, each cache memory stage comprising a static random access memory cell connected between a respective read/write amplifier and the at least one pair of input/output lines, the method comprising:
transferring the data item stored in a memory cell to be read in the matrix of memory cells to the static random access memory cell associated with the column containing the memory cell to be read; and
reading the data item transferred to the static random access memory cell.

35. A method according to claim 34, wherein each static random access memory cell comprises a pair of storage transistors, a pair of first access transistors connected between the respective read/write amplifier and the pair of storage transistors, and a data retention circuit, the method further comprising:

maintaining in the static random access memory cell a binary data corresponding to the data item stored in the memory cell using the data retention circuit.

36. A method according to claim 35, wherein the data retention circuit comprises a pair of second access transistors respectively connected between the at least one pair of input/output lines and the pair of storage transistors.

37. A method according to claim 36, wherein the pair of second access transistors have leakage currents greater than leakage currents of the pair of storage transistors and the pair of first access transistors.

38. A method according to claim 35, wherein the data retention circuit further comprises a pair of auxiliary transistors which are permanently turned off and are respectively connected between the pair of storage transistors and a voltage source, the pair of auxiliary transistors having leakage currents greater than leakage currents of the pair of storage transistors and the pairs of first and second access transistors.

39. A dynamic random access memory according to claim 38, wherein at least one of the pair of second access transistors and the pair of auxiliary transistors have a channel length and a gate oxide thickness smaller than a channel length and a gate oxide thickness of the pair of storage transistors and the pair of first access transistors.

40. A method according to claim 38, dynamic random access memory further comprises a substrate and wherein the static random access memory cell is formed thereon, and wherein the data retention circuit further comprises a voltage source, the method further comprising:

applying a voltage to the substrate with respect to the pair of storage transistors and the pair of first access transistors to obtain a leakage current of each auxiliary transistor or of each second access transistor which is at least 10 times greater than a leakage current of the pair of storage transistors and the pair of first access transistors.

41. A method according to claim 38, further comprising:

applying different predetermined bias voltages using the data retention circuit at selected terminals of each second access transistor or of each auxiliary transistor to cause a current to flow in each second access transistor or in each auxiliary transistor that is at least 10 times greater than a leakage current of the pair of storage transistors and the pair of first access transistors.

* * * * *